(12) United States Patent
Lichtenwalner et al.

(10) Patent No.: US 11,417,760 B2
(45) Date of Patent: *Aug. 16, 2022

(54) VERTICAL SEMICONDUCTOR DEVICE WITH IMPROVED RUGGEDNESS

(71) Applicant: Wolfspeed, Inc., Durham, NC (US)

(72) Inventors: Daniel Jenner Lichtenwalner, Raleigh, NC (US); Edward Robert Van Brunt, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 35 days.

This patent is subject to a terminal disclaimer.

(21) Appl. No.: 16/801,260

(22) Filed: Feb. 26, 2020

(65) Prior Publication Data

US 2020/0194584 A1 Jun. 18, 2020

Related U.S. Application Data

(63) Continuation of application No. 15/849,922, filed on Dec. 21, 2017, now Pat. No. 10,615,274.

(51) Int. Cl.
*H01L 29/78* (2006.01)
*H01L 29/10* (2006.01)
(Continued)

(52) U.S. Cl.
CPC ........ *H01L 29/7806* (2013.01); *H01L 21/046* (2013.01); *H01L 29/0619* (2013.01); *H01L 29/0878* (2013.01); *H01L 29/1095* (2013.01); *H01L 29/1608* (2013.01); *H01L 29/36* (2013.01); *H01L 29/6606* (2013.01);
(Continued)

(58) Field of Classification Search
None
See application file for complete search history.

(56) References Cited

U.S. PATENT DOCUMENTS

| 4,803,533 A | 2/1989 | Chang et al. |
| 5,136,349 A | 8/1992 | Yilmaz et al. |
| (Continued) | | |

FOREIGN PATENT DOCUMENTS

| CN | 102832248 A | 12/2012 |
| EP | 1143526 A2 | 10/2001 |
| (Continued) | | |

OTHER PUBLICATIONS

Konstantinov, et al., "Investigations of Lo-Hi-Lo and Delta-Doped Silicon Carbide Structures," Materials Research Society Symposium Proceedings, vol. 640, Jan. 2001, Materials Research Society, 6 pages.

(Continued)

*Primary Examiner* — Long Pham
(74) *Attorney, Agent, or Firm* — Withrow & Terranova, P.L.L.C.

(57) ABSTRACT

A vertical semiconductor device includes a substrate, a buffer layer over the substrate, and a drift layer over the buffer layer. The substrate has a first doping type and a first doping concentration. The buffer layer has the first doping type and a second doping concentration that is less than the first doping concentration. The drift layer has the first doping type and a third doping concentration that is less than the second doping concentration.

15 Claims, 13 Drawing Sheets

(51) Int. Cl.

| | |
|---|---|
| H01L 29/16 | (2006.01) |
| H01L 21/04 | (2006.01) |
| H01L 29/66 | (2006.01) |
| H01L 29/08 | (2006.01) |
| H01L 29/872 | (2006.01) |
| H01L 29/861 | (2006.01) |
| H01L 29/36 | (2006.01) |
| H01L 29/06 | (2006.01) |

(52) U.S. Cl.
CPC .. *H01L 29/66068* (2013.01); *H01L 29/66712* (2013.01); *H01L 29/7802* (2013.01); *H01L 29/861* (2013.01); *H01L 29/872* (2013.01)

(56) References Cited

U.S. PATENT DOCUMENTS

| | | |
|---|---|---|
| 5,661,314 A | 8/1997 | Merrill et al. |
| 5,665,987 A | 9/1997 | Muraoka et al. |
| 5,783,474 A | 7/1998 | Ajit |
| 5,844,259 A | 12/1998 | Kinzer et al. |
| 5,915,179 A | 6/1999 | Etou et al. |
| 6,031,265 A | 2/2000 | Hshieh |
| 6,084,268 A | 7/2000 | de Fresart et al. |
| 6,169,300 B1 | 1/2001 | Fragapane |
| 6,184,555 B1 | 2/2001 | Tihanyi et al. |
| 6,198,129 B1 | 3/2001 | Murakami |
| 6,573,534 B1 | 6/2003 | Kumar et al. |
| 6,847,091 B2 | 1/2005 | DeBoy et al. |
| 6,977,414 B2 | 12/2005 | Nakamura et al. |
| 7,795,691 B2 | 9/2010 | Zhang et al. |
| 7,989,882 B2 | 8/2011 | Zhang et al. |
| 8,211,770 B2 | 7/2012 | Zhang et al. |
| 8,232,558 B2 | 7/2012 | Zhang et al. |
| 8,829,533 B2 | 9/2014 | Domeij |
| 9,472,405 B2 | 10/2016 | Nakano |
| 9,530,844 B2 | 12/2016 | Zhang et al. |
| 2001/0020732 A1 | 9/2001 | Deboy et al. |
| 2003/0020136 A1 | 1/2003 | Kitabatake et al. |
| 2003/0073270 A1 | 4/2003 | Hisada et al. |
| 2003/0235942 A1 | 12/2003 | Nakamura et al. |
| 2004/0119076 A1 | 6/2004 | Ryu |
| 2006/0102908 A1 | 5/2006 | Imai et al. |
| 2006/0226494 A1 | 10/2006 | Hshieh |
| 2006/0267091 A1 | 11/2006 | Takahashi |
| 2007/0278571 A1 | 12/2007 | Bhalla et al. |
| 2008/0042172 A1 | 2/2008 | Hirler et al. |
| 2008/0157117 A1 | 7/2008 | McNutt et al. |
| 2008/0296771 A1 | 12/2008 | Das et al. |
| 2009/0134405 A1 | 5/2009 | Ota et al. |
| 2009/0302328 A1 | 12/2009 | Ohno et al. |
| 2010/0100931 A1 | 4/2010 | Novack et al. |
| 2010/0140628 A1 | 6/2010 | Zhang |
| 2010/0200931 A1 | 8/2010 | Matocha et al. |
| 2010/0295060 A1 | 11/2010 | Kudou et al. |
| 2010/0301335 A1 | 12/2010 | Ryu et al. |
| 2011/0006407 A1 | 1/2011 | Hirler |
| 2011/0049564 A1 | 3/2011 | Guan et al. |
| 2011/0057202 A1 | 3/2011 | Kono et al. |
| 2011/0101375 A1 | 5/2011 | Zhang |
| 2011/0306175 A1 | 12/2011 | Hebert et al. |
| 2012/0049902 A1 | 3/2012 | Corona et al. |
| 2012/0292742 A1 | 11/2012 | Itoh et al. |
| 2013/0092978 A1 | 4/2013 | Sugawara et al. |
| 2014/0183552 A1 | 7/2014 | Zhang et al. |
| 2014/0183553 A1 | 7/2014 | Zhang et al. |
| 2014/0284621 A1 | 9/2014 | Shimizu et al. |
| 2015/0014742 A1 | 1/2015 | Lu |
| 2015/0263145 A1 | 9/2015 | Pala et al. |
| 2015/0311325 A1 | 10/2015 | Zhang |
| 2016/0056306 A1 | 2/2016 | Masuoka et al. |
| 2017/0053987 A1 | 2/2017 | Zhang et al. |
| 2018/0108789 A1* | 4/2018 | Vobecky ............ H01L 29/7395 |
| 2018/0190651 A1 | 7/2018 | Siemieniec et al. |
| 2019/0198659 A1 | 6/2019 | Lichtenwalner et al. |

FOREIGN PATENT DOCUMENTS

| | | |
|---|---|---|
| EP | 1429392 A2 | 6/2004 |
| EP | 1737042 A1 | 12/2006 |
| EP | 1965432 A1 | 9/2008 |
| EP | 2068363 A2 | 6/2009 |
| EP | 2581939 A2 | 4/2013 |
| GB | 2033658 A | 5/1980 |
| GB | 2243952 A | 11/1991 |
| JP | S60196975 A | 10/1985 |
| JP | H03142972 A | 6/1991 |
| JP | H04239778 A | 8/1992 |
| JP | H0778978 A | 3/1995 |
| JP | H10308510 A | 11/1998 |
| JP | H11330091 A | 11/1999 |
| JP | 2004193578 A | 7/2004 |
| JP | 2005191241 A | 7/2005 |
| JP | 2009158788 A | 7/2009 |
| JP | 2011258635 A | 12/2011 |
| JP | 2012235002 A | 11/2012 |
| JP | 2013089700 A | 5/2013 |
| JP | 2014022708 A | 2/2014 |
| WO | 2014013821 A1 | 1/2014 |
| WO | 2012105611 A1 | 7/2014 |
| WO | 2020002653 A1 | 1/2020 |

OTHER PUBLICATIONS

Examination Report for European Patent Application No. 18840110. 3, dated Sep. 13, 2021, 6 pages.
Tamaki, Tomohiro, et al., "Optimization of ON-State and Switching Performances for 15-20-kV 4H-SiC IGBTs," IEEE Transactions on Electron Devices, vol. 55, Issue 8, Aug. 2008, IEEE, pp. 1920-1927.
Non-Final Office Action for U.S. Appl. No. 13/730,068, dated Feb. 6, 2015, 20 pages.
Final Office Action for U.S. Appl. No. 13/730,068, dated Jul. 22, 2015, 13 pages.
Advisory Action for U.S. Appl. No. 13/730,068, dated Oct. 7, 2015, 4 pages.
Examiner's Answer for U.S. Appl. No. 13/730,068, dated May 26, 2016, 8 pages.
Non-Final Office Action for U.S. Appl. No. 13/730,133, dated Nov. 7, 2014, 18 pages.
Final Office Action for U.S. Appl. No. 13/730,133, dated May 8, 2015, 19 pages.
Advisory Action for U.S. Appl. No. 13/730,133, dated Jul. 15, 2015, 3 pages.
Non-Final Office Action for U.S. Appl. No. 13/730,133, dated Aug. 12, 2015, 17 pages.
Final Office Action for U.S. Appl. No. 13/730,133, dated Feb. 17, 2016, 17 pages.
Advisory Action, Applicant-Initiated Interview Summary, and AFCP 2.0 Decision for U.S. Appl. No. 13/730,133, dated May 5, 2016, 9 pages.
Notice of Allowance for U.S. Appl. No. 13/730,133, dated Aug. 8, 2016, 7 pages.
Non-Final Office Action for U.S. Appl. No. 14/212,991, dated Oct. 8, 2015, 22 pages.
Non-Final Office Action for U.S. Appl. No. 14/212,991, dated May 6, 2016, 16 pages.
Final Office Action for U.S. Appl. No. 14/212,991, dated Nov. 23, 2016, 21 pages.
Non-Final Office Action for U.S. Appl. No. 14/259,821, dated Mar. 24, 2015, 6 pages.
Final Office Action for U.S. Appl. No. 14/259,821, dated Aug. 24, 2015, 7 pages.
Advisory Action for U.S. Appl. No. 14/259,821, dated Nov. 6, 2015, 3 pages.
Non-Final Office Action for U.S. Appl. No. 14/259,821, dated Jan. 7, 2016, 7 pages.
International Search Report and Written Opinion for International Application PCT/US2013/073092 dated Feb. 17, 2014, 14 pages.
International Preliminary Report on Patentability for PCT/US2013/073092, dated Jul. 9, 2015, 9 pages.

(56) References Cited

OTHER PUBLICATIONS

Notice of Preliminary Rejection for Korean Patent Application No. 10-2015-7020113, dated Jun. 27, 2016, 22 pages.
International Search Report and Written Opinion for International Application PCT/US2013/073093 dated Apr. 1, 2014, 15 pages.
International Preliminary Report on Patentability for PCT/US2013/073093, dated Jul. 9, 2015, 11 pages.
International Search Report and Written Opinion for International Application PCT/US2015/011015, dated Sep. 30, 2015, 15 pages.
International Preliminary Report on Patentability for International Patent Application No. PCT/US2015/011015, dated Sep. 22, 2016, 11 pages.
"Definition of a Random Number," Oxford English Dictionary, Available online at: <<https://en.oxforddictionaries.com/definition/random_number>, Accessed May 25, 2018.
Decision on Appeal for U.S. Appl. No. 13/730,068, dated Sep. 11, 2017, 11 pages.
Non-Final Office Action for U.S. Appl. No. 13/730,068, dated Dec. 28, 2017, 17 pages.
Notice of Allowance for U.S. Appl. No. 13/730,068, dated Jun. 20, 2018, 8 pages.
Non-Final Office Action for U.S. Appl. No. 15/344,735, dated Mar. 22, 2017, 17 pages.
Final Office Action for U.S. Appl. No. 15/344,735, dated Aug. 22, 2017, 21 pages.
Advisory Action for U.S. Appl. No. 15/344,735, dated Oct. 27, 2017, 6 pages.
Non-Final Office Action for U.S. Appl. No. 15/344,735, dated Feb. 8, 2018, 24 pages.
Final Office Action for U.S. Appl. No. 15/344,735, dated May 31, 2018, 25 pages.
Advisory Action for U.S. Appl. No. 15/344,735, dated Aug. 9, 2018, 7 pages.
Advisory Action for U.S. Appl. No. 14/212,991, dated Feb. 6, 2017, 3 pages.
Non-Final Office Action for U.S. Appl. No. 14/212,991, dated Apr. 6, 2017, 19 pages.
Final Office Action for U.S. Appl. No. 14/212,991, dated Nov. 2, 2017, 20 pages.
Advisory Action for U.S. Appl. No. 14/212,991, dated Feb. 20, 2018, 6 pages.
Final Office Action for U.S. Appl. No. 14/259,821, dated Jan. 26, 2017, 11 pages.
Advisory Action for U.S. Appl. No. 14/259,821, dated Apr. 21, 2017, 3 pages.
Non-Final Office Action for U.S. Appl. No. 14/259,821, dated Aug. 28, 2017, 11 pages.
Final Office Action for U.S. Appl. No. 14/259,821, dated Mar. 28, 2018, 12 pages.
Advisory Action for U.S. Appl. No. 14/259,821, dated Jun. 15, 2018, 3 pages.
Examination Report for European Patent Application No. 13806028.0, dated Mar. 6, 2018, 7 pages.
Notice of Reasons for Rejection for Japanese Patent Application No. 2015-550411, dated May 9, 2017, 19 pages.
Decision of Rejection for Japanese Patent Application No. 2015-550411, dated Sep. 12, 2017, 10 pages.
Notice of Completion of Pretrial Examination for Japanese Patent Application No. 2015-550411, dated Feb. 1, 2018, 4 pages.
Report of Reconsideration by Examiner before Appeal for Japanese Patent Application No. 2015-550411, dated Feb. 1, 2018, 6 pages.
First Office Action and Search Report for Chinese Patent Application No. 201380068265.9, dated Mar. 13, 2017, 24 pages.
Second Office Action for Chinese Patent Application No. 201380068265.9, dated Nov. 29, 2017, 14 pages.
Third Office Action for Chinese Patent Application No. 201380068265.9, dated Aug. 10, 2018, 24 pages.
Examination Report for European Patent Application No. 13811320.4, dated Feb. 2, 2018, 4 pages.
Notice of Reasons for Rejection for Japanese Patent Application No. 2015-550412, dated Nov. 21, 2017, 9 pages.
Notice of Reasons for Rejection for Japanese Patent Application No. 2015-550412, dated May 15, 2018, 13 pages.
Notice of Allowance for Korean Patent Application No. 10-2015-7020113, dated Feb. 4, 2017, 4 pages.
Notification of Reasons for Refusal for Japanese Patent Application No. 2016-557300, dated Sep. 11, 2018, 9 pages.
Non-Final Office Action for U.S. Appl. No. 16/148,214, dated Feb. 28, 2019, 17 pages.
Final Office Action for U.S. Appl. No. 16/148,214, dated May 16, 2019, 21 pages.
Non-Final Office Action for U.S. Appl. No. 16/148,214, dated Nov. 15, 2019, 19 pages.
Final Office Action for U.S. Appl. No. 16/148,214, dated Mar. 19, 2020, 22 pages.
Notice of Allowance for U.S. Appl. No. 16/148,214, dated Jul. 10, 2020, 7 pages.
Examiner's Answer for U.S. Appl. No. 15/344,735, dated Feb. 8, 2019, 11 pages.
Decision on Appeal for U.S. Appl. No. 15/344,735, dated Mar. 26, 2020, 18 pages.
Notice of Allowance for U.S. Appl. No. 15/344,735, dated Jun. 10, 2020, 8 pages.
Non-Final Office Action for U.S. Appl. No. 14/212,991, dated Dec. 28, 2018, 24 pages.
Final Office Action for U.S. Appl. No. 14/212,991, dated Oct. 28, 2019, 27 pages.
Examiner's Answer to the Appeal Brief for U.S. Appl. No. 14/212,991, dated Jul. 24, 2020, 10 pages.
Decision on Appeal for U.S. Appl. No. 14/259,821, dated Jul. 22, 2020, 10 pages.
Examiner's Answer for U.S. Appl. No. 14/259,821, dated Feb. 13, 2019, 13 pages.
Summons to Attend Oral Proceedings for European Patent Application No. 13806028.0, dated Oct. 30, 2018, 6 pages.
Result of Consultation for European Patent Application No. 13806028.0, dated Mar. 14, 2019, 3 pages.
Decision to Refuse for European Patent Application No. 13806028.0, dated Apr. 18, 2019, 8 pages.
Trial and Appeal Decision for Japanese Patent Application No. 2015-550411, dated Jul. 2, 2019, 35 pages.
Proposed Claim Amendments for Examiner Initiated Telephone Message for Chinese Patent Application No. 201380068265.9, dated Oct. 30, 2018, 5 pages.
Examination Report for European Patent Application No. 13811320.4, dated Oct. 22, 2019, 6 pages.
Summons to Attend Oral Proceedings for European Patent Application No. 13811320.4, dated May 12, 2020, 5 pages.
Decision to Grant a Patent for Japanese Patent Application No. 2015-550412, dated Jan. 8, 2019, 4 pages.
Examination Report for European Patent Application No. 15745260.8, dated Jun. 24, 2019, 11 pages.
Decision of Rejection for Japanese Patent Application No. 2016-557300, dated Apr. 9, 2019, 6 pages.
Pretrial Report for Japanese Patent Application No. 2016-557300, dated Oct. 4, 2019, 11 pages.
Notice of Termination of Reconsideration by Examiners before Appeal Proceedings for Japanese Patent Application No. 2016-557300, dated Oct. 23, 2019, 3 pages.
Notice of Reasons for Rejection for Japanese Patent Application No. 2016-55730, dated Jun. 2, 2020, 15 pages.
Akturk, A., et al., "Single Event Effects in Si and SiC Power MOSFETs Due to Terrestrial Neutrons," IEEE Transactions on Nuclear Science, vol. 64, No. 1, Jan. 2017, pp. 529-535.
Liu, S., et al., "Single-Event Burnout and Avalanche Characteristics of Power DMOSFETs," IEEE Transactions on Nuclear Science, vol. 53, No. 6, Dec. 19, 2006, pp. 3379-3385.
Liu, S., et al., "Effect of Buffer Layer on Single-Event Burnout of Power DMOSFETs," IEEE Transactions on Nuclear Science, vol. 54, No. 6, Dec. 12, 2007, pp. 2554-2560.

(56) References Cited

OTHER PUBLICATIONS

Normand, E., et al., "Neutron-induced single event burnout in high voltage electronics," IEEE Transactions on Nuclear Science, vol. 44, No. 6, Dec. 1997, pp. 2358-2366.
Zeller, H.R., "Cosmic ray induced failures in high power semiconductor devices," Solid-State Electronics, vol. 38, No. 12, Dec. 1995, pp. 2041-2046.
Non-Final Office Action for U.S. Appl. No. 15/849,922, dated Dec. 20, 2018, 7 pages.
Final Office Action for U.S. Appl. No. 15/849,922, dated Jul. 8, 2019, 7 pages.
International Search Report and Written Opinion for International Patent Application No. PCT/US2018/065101, dated Mar. 20, 2019, 12 pages.
International Preliminary Report on Patentability for International Patent Application No. PCT/US2018/065101, dated Jul. 2, 2020, 7 pages.
Invitation to Pay Additional Fees and Partial Search for International Patent Application No. PCT/US2021/041532, dated Nov. 2, 2021, 11 pages.
Non-Final Office Action for U.S. Appl. No. 16/938,032, dated Jan. 27, 2022, 8 pages.
International Search Report and Written Opinion for International Patent Application No. PCT/US2021/041532, dated Jan. 13, 2022, 18 pages.

\* cited by examiner

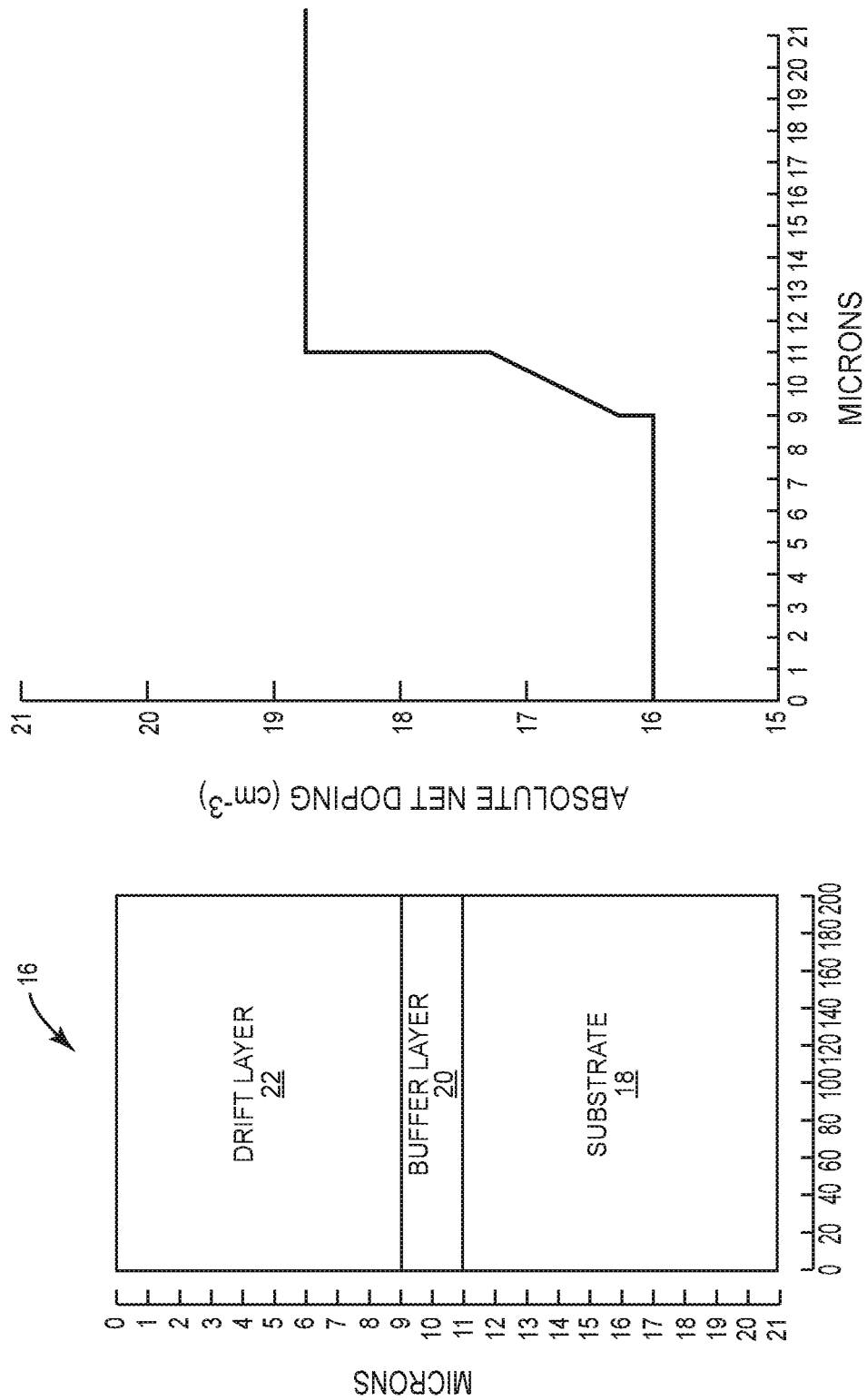

VERTICAL SEMICONDUCTOR DEVICE WITH IMPROVED RUGGEDNESS

RELATED APPLICATIONS

This application is a continuation of U.S. patent application Ser. No. 15/849,922, filed Dec. 21, 2017, now U.S. Pat. No. 10,615,274, the disclosure of which is hereby incorporated herein by reference in its entirety.

FIELD OF THE DISCLOSURE

The present disclosure relates to vertical semiconductor devices, and in particular to vertical semiconductor devices for power applications with improved ruggedness due to increased radiation tolerance.

BACKGROUND

Vertical semiconductor devices come in several varieties, each of which may be used for different applications. One notable use of vertical semiconductor devices is for high power applications. In particular, devices such as PiN diodes, Schottky diodes, and vertical metal-oxide semiconductor field-effect transistors (MOSFETs) may be rated for high blocking voltages and thus are often used for these power applications. For purposes of illustration, FIG. 1 shows the general structure of a conventional vertical semiconductor device 10. The conventional vertical semiconductor device 10 includes a substrate 12 and a drift layer 14 over the substrate 12. A graph shows the relative doping concentrations for the substrate 12 and the drift layer 14. As shown, the substrate 12 is much more heavily doped than the drift layer 14. Implanted regions, additional semiconductor layers, and/or metal layers may be added to the conventional vertical semiconductor device 10 to provide a PiN diode, a Schottky diode, a MOSFET, or any other type of device. When finished, the conventional vertical semiconductor device 10 may provide a high blocking voltage and thus may be useful for high power applications as discussed above. However, the conventional vertical semiconductor device 10 may be subject to failure at high blocking voltages due to radiation intolerance.

SUMMARY

The present disclosure relates to vertical semiconductor devices, and in particular to vertical semiconductor devices for power applications with improved ruggedness due to increased radiation tolerance. In one embodiment, a vertical semiconductor device includes a substrate, a buffer layer over the substrate, and a drift layer over the buffer layer. The substrate has a first doping type and a first doping concentration. The buffer layer has the first doping type and a second doping concentration that is less than the first doping concentration. The drift layer has the first doping type and a third doping concentration that is less than the second doping concentration. Providing the substrate, the buffer layer, and the drift layer in this manner increases the radiation tolerance of the vertical semiconductor device and thus increases the ruggedness thereof.

In one embodiment, a method includes the steps of providing a substrate, providing a buffer layer over the substrate, and providing a drift layer over the buffer layer. The substrate has a first doping type and a first doping concentration. The buffer layer has the first doping type and a second doping concentration that is less than the first doping concentration. The drift layer has the first doping type and a third doping concentration that is less than the second doping concentration. Providing the substrate, the buffer layer, and the drift layer in this manner increases the radiation tolerance of the vertical semiconductor device and thus increases the ruggedness thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5 illustrates a vertical semiconductor device according to one embodiment of the present disclosure.

DETAILED DESCRIPTION

Figure 1:
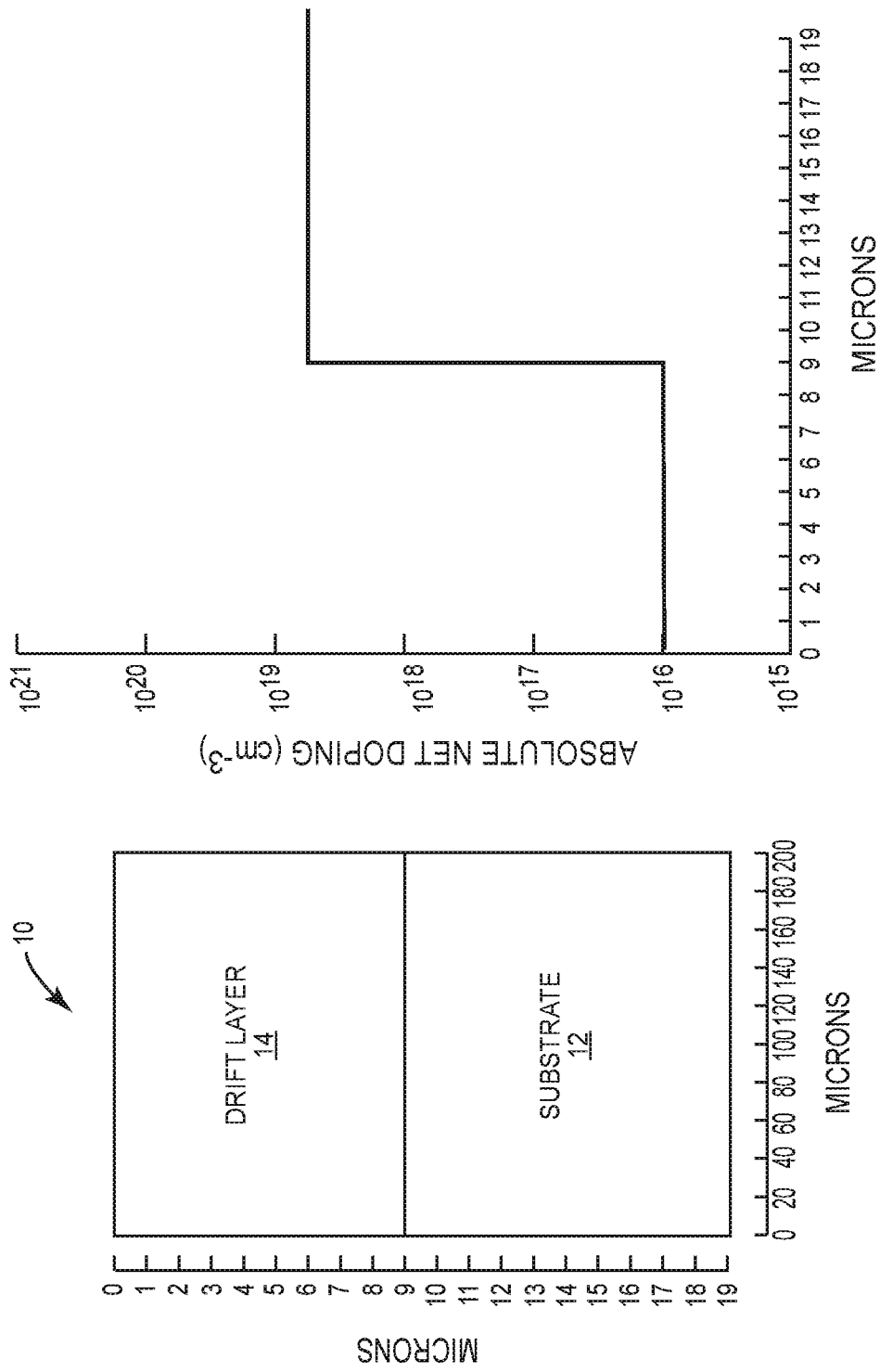
FIG. 1 illustrates a conventional vertical semiconductor device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
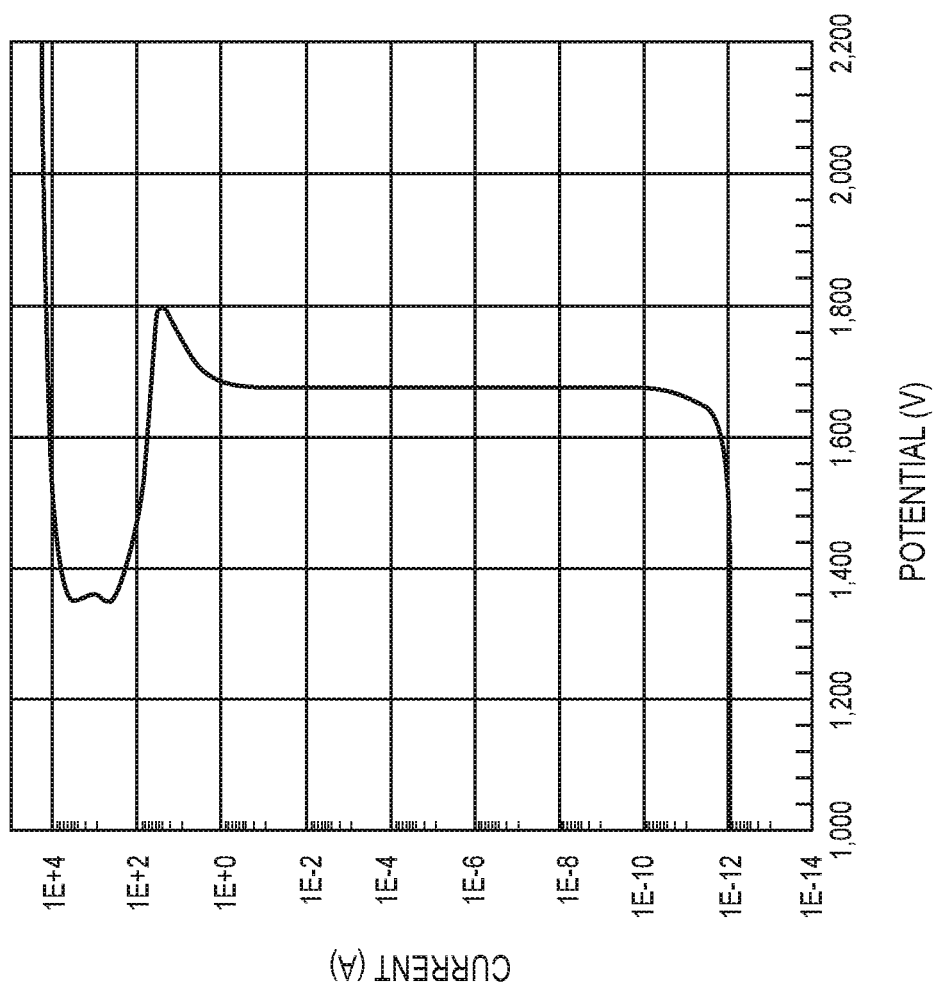
FIG. 2 is a graph illustrating the operating characteristics of a conventional vertical semiconductor device.

FIG. 2 is a graph illustrating an exemplary relationship between current through the conventional vertical semiconductor device 10 and voltage across the conventional vertical semiconductor device 10. As shown, the current through the device maintains relatively consistent leakage current at 1 pico-Amps for blocking voltages up to 1600 Volts (this graph is applicable to devices rated for blocking voltages up to 1200 Volts and forward currents up to 50 Amps, similar curves will show the same general characteristics for devices having other ratings). Above 1600 Volts, the conventional vertical semiconductor device 10 begins to experience avalanche breakdown, and the current through the device thus increases sharply. Above 1 Amps, the conventional vertical semiconductor device 10 experiences a second breakdown in which the current through the device continues to increase, and the voltage across the device decreases sharply. The extent to which the conventional vertical semiconductor device 10 experiences this second breakdown (i.e., the voltage at which second breakdown occurs) is proportional to the ability of the device to withstand radiation. This is because when operating at high voltages, radiation particles such as terrestrial neutrons or heavy ions may collide with charge particles in the device, knocking these charge particles loose and causing a cascade effect that results in the device "jumping" from the bottom portion of the curve shown in FIG. 2 to the top portion in which second breakdown occurs. If this occurs, the conventional vertical semiconductor device 10 will catastrophically fail.

Figure 3:
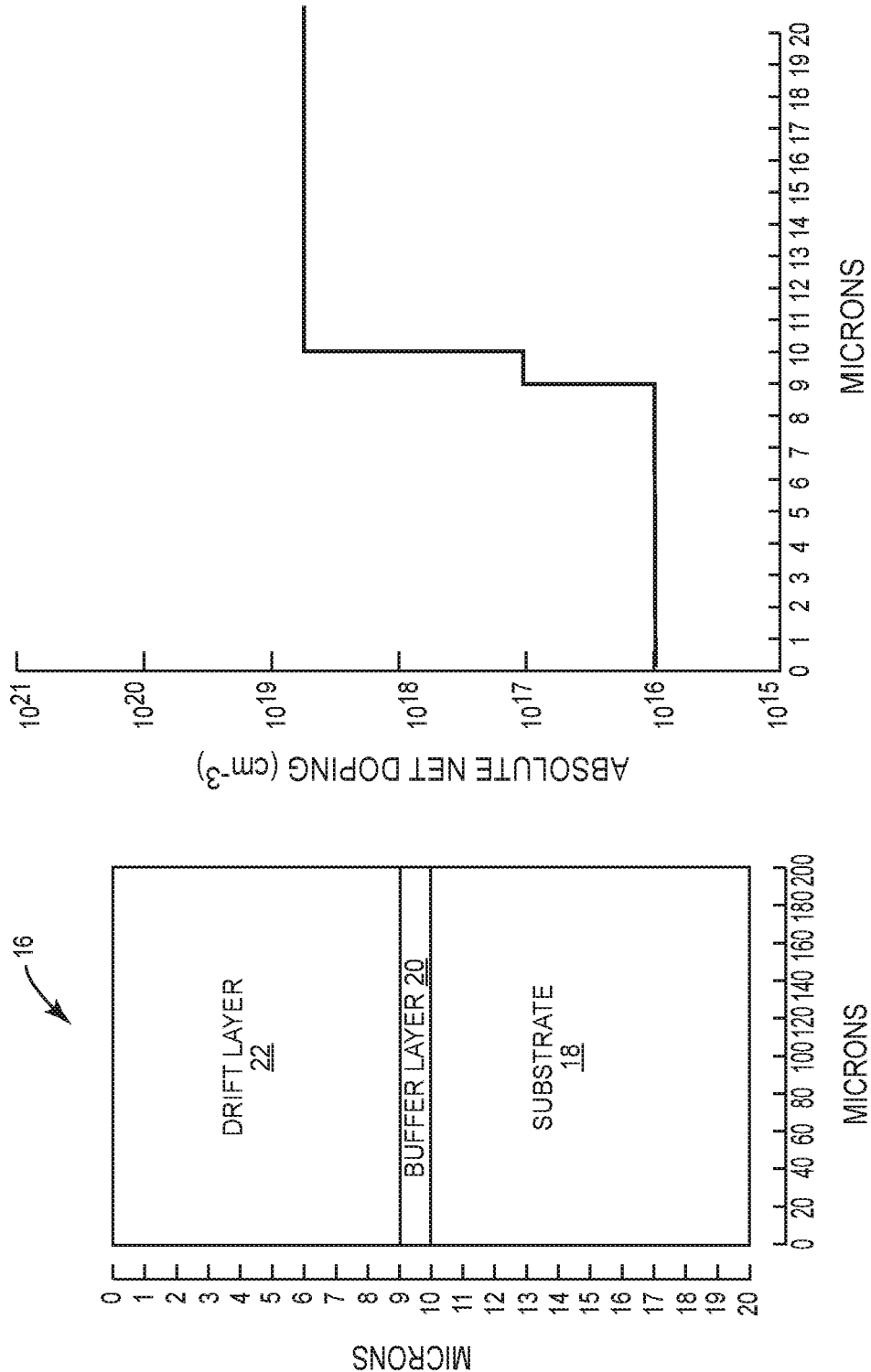
FIG. 3 illustrates a vertical semiconductor device according to one embodiment of the present disclosure.

In light of the above, there is a need for vertical semiconductors with improved radiation tolerance and thus increased ruggedness. Accordingly, FIG. 3 shows the basic structure of a vertical semiconductor device 16 according to one embodiment of the present disclosure. The vertical semiconductor device 16 includes a substrate 18, a buffer layer 20 over the substrate 18, and a drift layer 22 over the buffer layer 20. A graph shows the relative doping concentrations of the substrate 18, the buffer layer 20, and the drift layer 22. As shown, the substrate 18 is more heavily doped than the buffer layer 20, which is in turn more heavily doped than the drift layer 22. In particular, the substrate 18, the buffer layer 20, and the drift layer 22 are all doped in a relatively consistent manner and thus form a step doping profile as shown. Providing the buffer layer 20 with a doping concentration that is higher than the drift layer 22 but lower than the substrate 18 creates a buffer for charge particles that may be accelerated by collisions with radiated particles, allowing these accelerated charge particles to recombine instead of passing through the vertical semiconductor device 16.

Notably, the thickness and doping concentrations of the substrate 18, the buffer layer 20, and the drift layer 22 are merely exemplary. In particular, these thicknesses and doping concentrations are shown for a device rated for 1200 Volts. Those skilled in the art will readily appreciate that higher blocking voltages may dictate greater thicknesses for the drift layer 22, and in some embodiments, the buffer layer 20, and/or decreased doping concentrations for the same. However, the relationship between the thicknesses and doping concentrations of these layers will remain relatively unchanged. In one embodiment, a thickness of the buffer layer 20 may be between 5% and 35% the thickness of the drift layer 22. In specific embodiments, a thickness of the buffer layer 20 may be between 5% and 10% the thickness of the drift layer 22, between 10% and 15% the thickness of the drift layer 22, between 15% and 20% the thickness of the drift layer 22, between 20% and 25% the thickness of the drift layer, between 25% and 30% the thickness of the drift layer 22, between 30% and 35% the thickness of the drift layer 22, between 15% and 15% the thickness of the drift layer 22, and between 25% and 35% the thickness of the drift layer 22. Further, the doping concentration of the buffer layer 20 may vary between 20% and 90% the doping concentration of the substrate 18 while remaining greater than the doping concentration of the drift layer 22 by at least 20%. In specific embodiments, the doping concentration of the buffer layer 20 may be between 20% and 30% the doping concentration of the substrate 18, between 30% and 40% the doping concentration of the substrate 18, between 40% and 50% the doping concentration of the substrate 18, between 50% and 60% the doping concentration of the substrate 18, between 60% and 70% the doping concentration of the substrate 18, between 70% and 80% the doping concentration of the substrate 18, and between 80% and 90% the doping concentration of the substrate 18.

In one embodiment, the substrate 18, the buffer layer 20, and the drift layer 22 are silicon carbide (SiC). Accordingly, the buffer layer 20 may be an epitaxial layer that is grown on the substrate 18 before the drift layer 22. The drift layer 22 may then be grown over the buffer layer 20. The buffer layer 20 may be grown in an environment with dopants to provide the desired doping concentrations, or grown and subsequently implanted (e.g., via ion implantation) to the desired doping concentration. In other embodiments, the buffer layer 20 may be an implanted region in the surface of the substrate 18. Since the substrate 18 is more highly doped than the desired doping level for the buffer layer 20, the substrate 18 may be doped with an opposite doping type (e.g., if the substrate 18 is an n-type substrate, it may be doped with a p-dopant) to decrease the net doping concentration thereof. Notably, the principles of the present disclosure apply equally to n-type or p-type substrates, buffer layers, and drift layers. That is, the principles of the present disclosure may be equally applied to n-type and p-type devices.

Figure 4B:
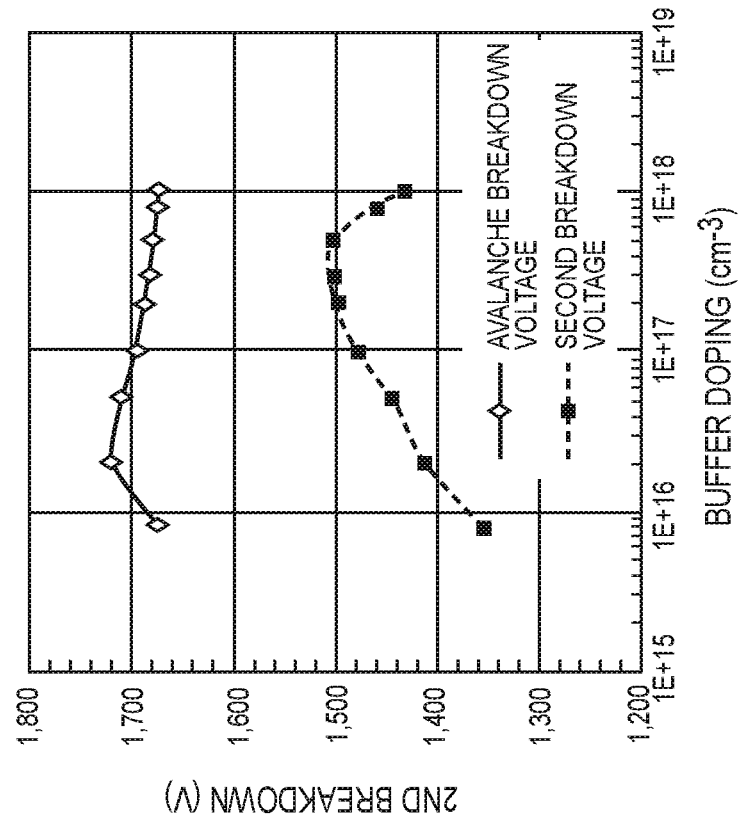
FIGS. 4A through 4C are graphs illustrating various operating characteristics of a vertical semiconductor device according to one embodiment of the present disclosure.
Figure 4A:
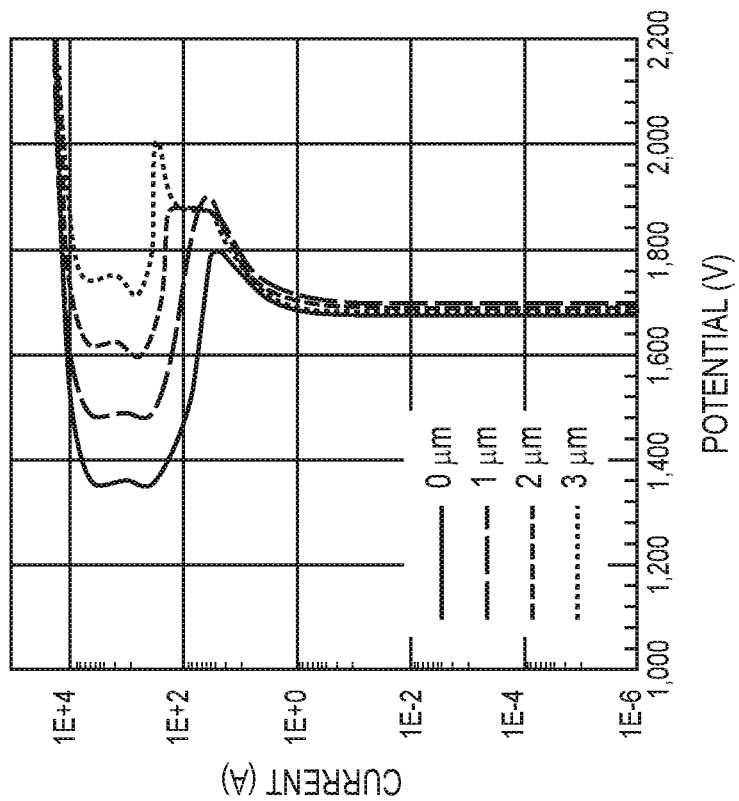

FIG. 4A is a graph illustrating the effect of the buffer layer 20 on the second breakdown of the vertical semiconductor device 16. In particular, FIG. 4A shows a relationship between current through the vertical semiconductor device 16 and voltage across the vertical semiconductor device 16 for several different thicknesses of the buffer layer 20 at a doping concentration of $10^{17}$ cm$^{-3}$. As shown, as the thickness of the buffer layer 20 increases, the voltage at which second breakdown occurs also increases. As defined herein, the second breakdown voltage is the lowest voltage at which the second breakdown occurs, and reflects the left-most point of the upper portion of the graph shown in FIG. 4A. Increasing the second breakdown voltage may significantly increase the radiation tolerance and thus ruggedness of the vertical semiconductor device 16. In one embodiment, the buffer layer 20 increases the second breakdown voltage such that it is greater than the avalanche voltage.

FIG. 4B is a graph illustrating the effect of the buffer layer 20 on both the avalanche breakdown voltage and the second breakdown voltage. In particular, FIG. 4B shows a relationship between the avalanche breakdown voltage and the second breakdown voltage to a doping concentration of the buffer layer 20 when the buffer layer is 1 µm thick. As shown, as the doping concentration of the buffer layer 20 increases, the second breakdown voltage similarly increases, up to a certain point, where it begins to decline rapidly. Notably, the doping concentration of the buffer layer 20 has a minimal effect on the avalanche breakdown voltage, and thus using the buffer layer 20 does not decrease the performance of the vertical semiconductor device 16.

Figure 4C:
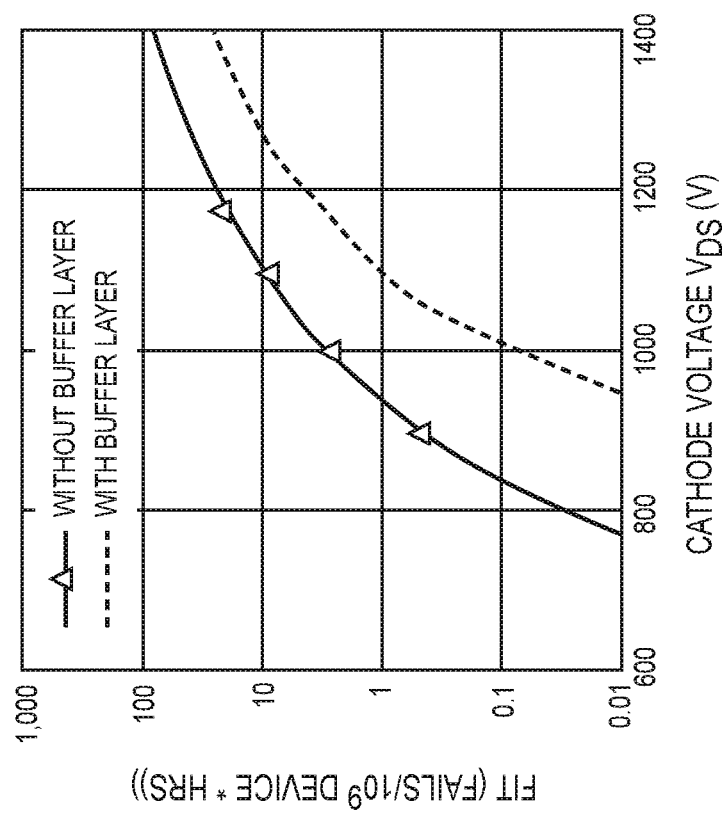

FIG. 4C is a graph illustrating the effect of the buffer layer 20 on the failure rate of the vertical semiconductor device 16. In particular, FIG. 4C shows a relationship between failure rate (as a function of device hours) and voltage across the device. A first line shows the failure rate for devices not including the buffer layer 20, while a second line shows the failure rate for devices including the buffer layer 20. As illustrated, the failure rate of devices including the buffer layer 20 is significantly lower for a given device voltage.

FIG. 5 shows the vertical semiconductor device 16 according to an additional embodiment of the present disclosure. The vertical semiconductor device 16 shown in FIG. 5 is substantially similar to that shown in FIG. 3, except for the doping profile of the device and the relative thicknesses of the layers. In particular, the buffer layer 20 provides a linearly graded doping concentration that decreases in proportion to a distance from the drift layer 22 such that the overall doping profile of the device includes a step between the drift layer 22 and the buffer layer 20 and another step between the buffer layer 20 and the substrate 18. In this embodiment, the buffer layer 20 may be thicker to allow for the linear transition in the doping profile thereof. Such a doping profile may be created by first growing the buffer layer 20 and then performing ion implantation on it, or by growing the buffer layer 20 in an environment wherein the concentration of dopants are controlled throughout the growth process. Notably, this doping profile is merely exemplary, and any linearly graded doping concentration may be substituted for the one shown in FIG. 5 without departing from the principles of the present disclosure.

Figure 6:
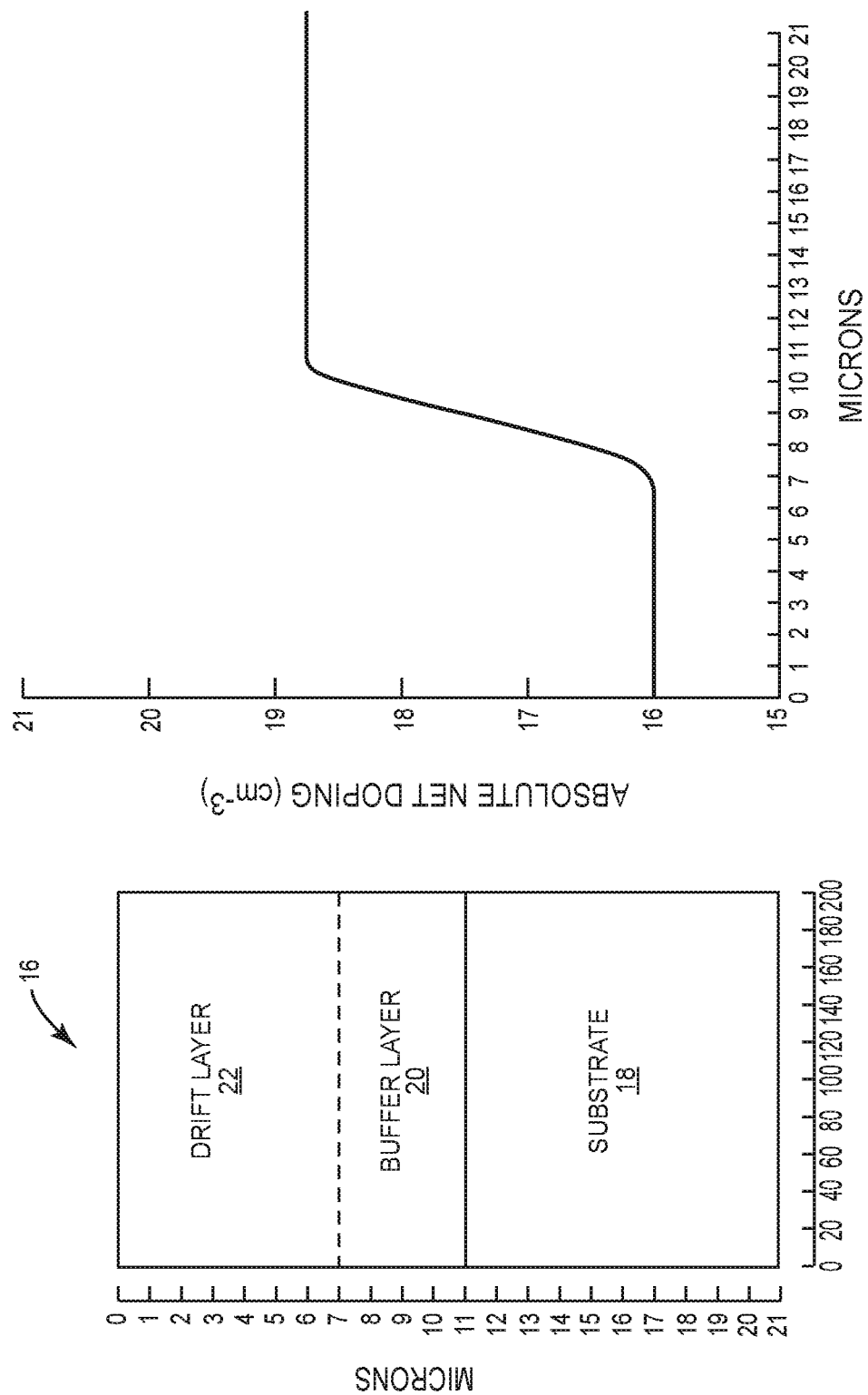
FIG. 6 illustrates a vertical semiconductor device according to one embodiment of the present disclosure.

FIG. 6 shows the vertical semiconductor device 16 according to an additional embodiment of the present disclosure. The vertical semiconductor device 16 shown in FIG. 6 is substantially similar to that shown in FIG. 3 except for the doping profile of the device and the relative thicknesses of the layers. In particular, the buffer layer 20 provides a substantially smooth transition between the doping concentration of the drift layer 22 and the doping concentration of the substrate 18. In this embodiment, the buffer layer 20 may be substantially thicker to allow for the transition in the doping profile thereof. Such a doping profile may be created by first growing the buffer layer 20 and then performing ion implantation on it, or by growing the buffer layer 20 in an environment wherein the concentration of dopants are controlled throughout the growth process. Notably, this doping profile is merely exemplary, and any graded doping concentration, linear or otherwise, may be substituted for the one shown in FIG. 6 without departing from the principles of the present disclosure.

Figure 7:
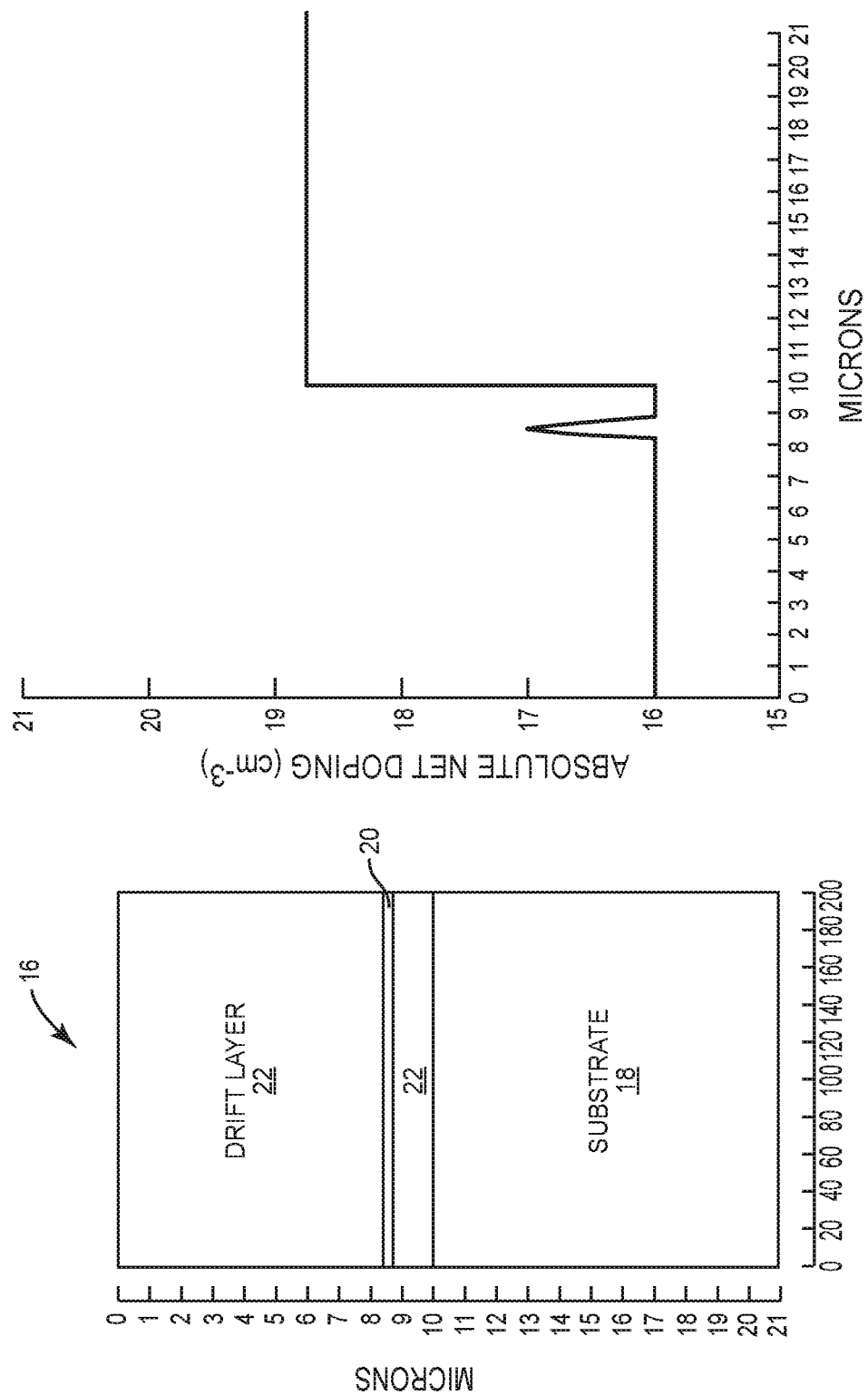
FIG. 7 illustrates a vertical semiconductor device according to one embodiment of the present disclosure.

FIG. 7 shows the vertical semiconductor device 16 according to an additional embodiment of the present disclosure. The vertical semiconductor device 16 shown in FIG. 7 is substantially similar to that shown in FIG. 3 except for the doping profile of the device and the relative thicknesses of the layers. In particular, the buffer layer 20 is provided as a doping "spike" and is not directly over the substrate 18. In this embodiment, the buffer layer 20 may be reduced in thickness. Such a doping profile may be formed either via separate growth on top of a small portion of the drift layer 22 or by growing a small portion of the drift layer 22, performing ion implantation to create the buffer layer 20, then growing the rest of the drift layer 22. Notably, this doping profile is merely exemplary, and any "spike" doping profile may be substituted for the one shown in FIG. 7 without departing from the principles of the present disclosure.

Figure 8:
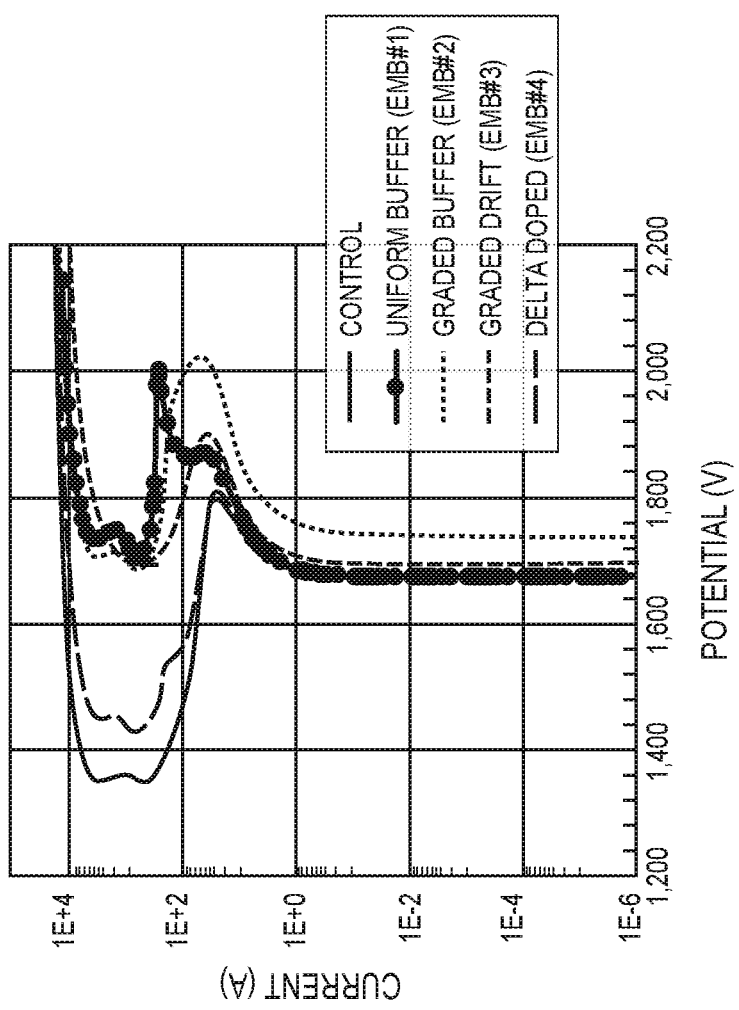
FIG. 8 is a graph illustrating the operating characteristics of vertical semiconductor devices according to various embodiments of the present disclosure.

FIG. 8 shows the effect of the buffer layer 20 for the embodiments shown in FIGS. 3, 5, 6 and 7 on the second breakdown of the vertical semiconductor device 16. As shown, the buffer layer 20 significantly increases the second breakdown voltage for each embodiment when compared to a conventional vertical semiconductor device not including the buffer layer 20. As discussed above, this results in a significantly increased radiation tolerance and thus improved ruggedness of the vertical semiconductor device 16.

Figure 9:
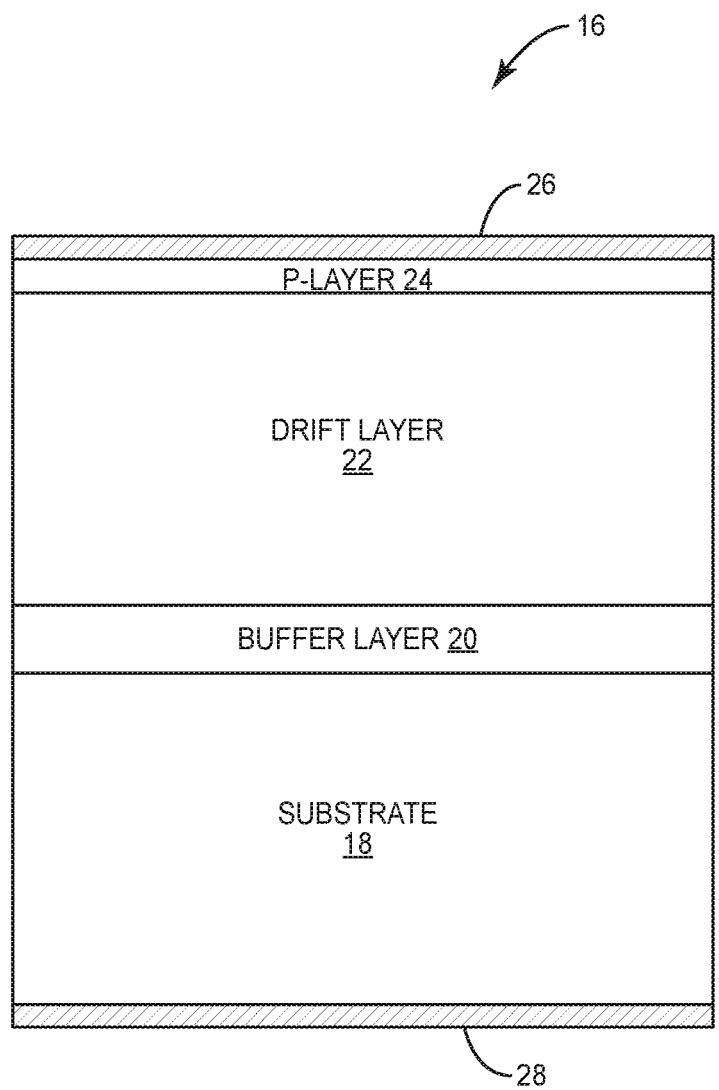
FIG. 9 illustrates a PiN diode according to one embodiment of the present disclosure.
Figure 10:
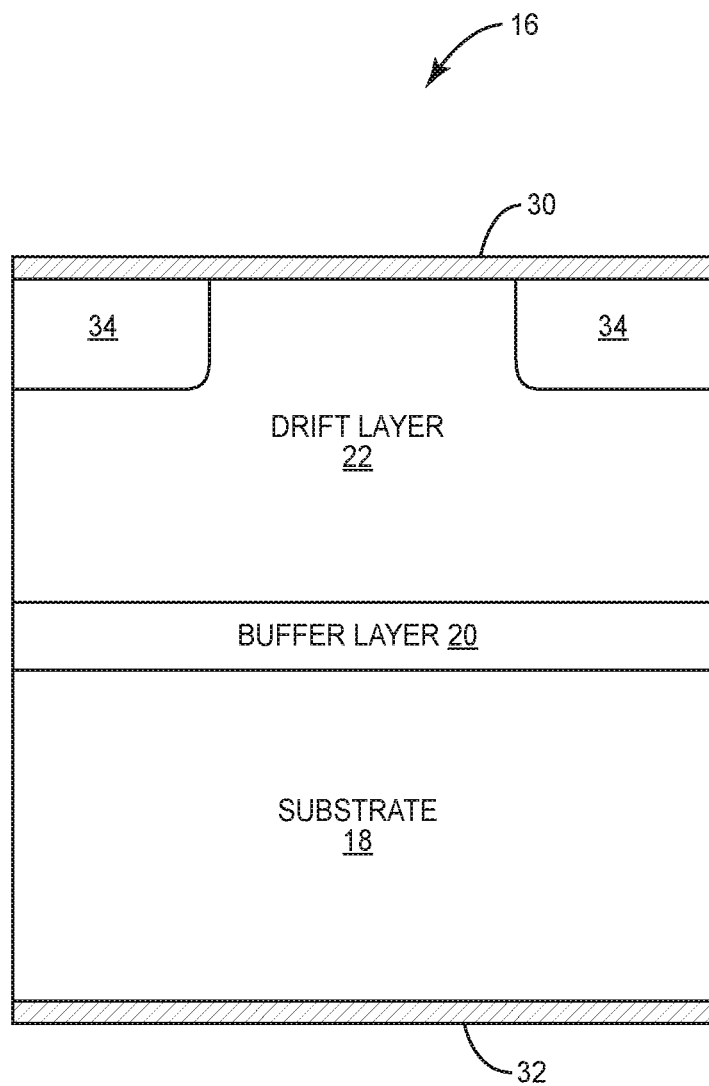
FIG. 10 illustrates a Schottky barrier diode according to one embodiment of the present disclosure.
Figure 11:
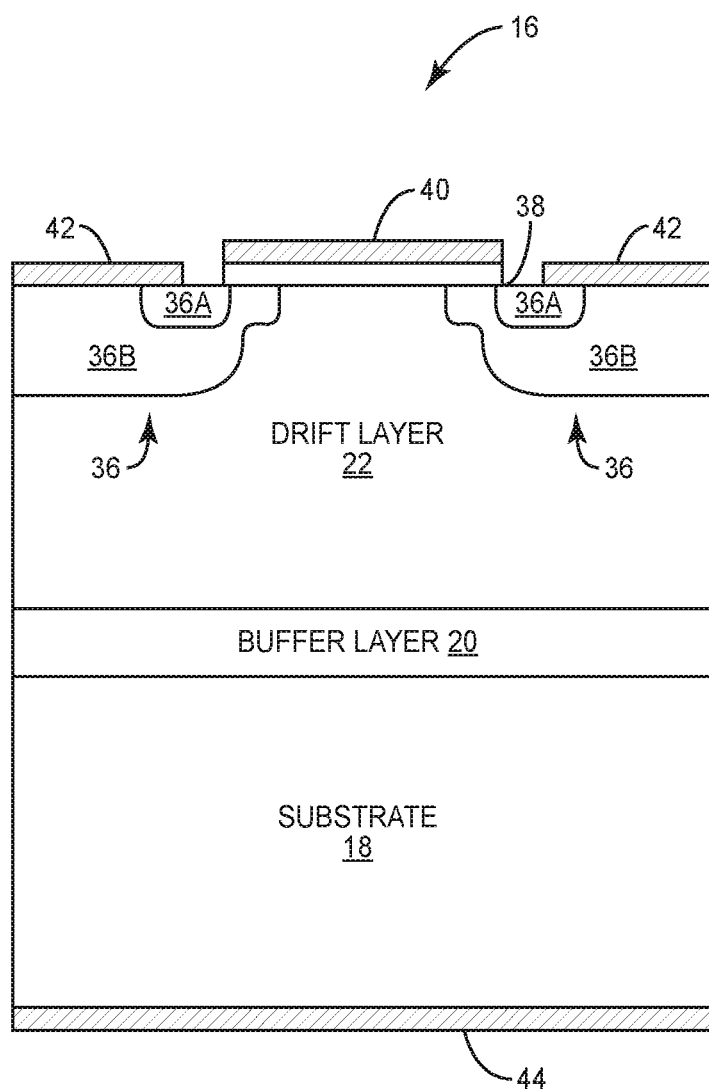
FIG. 11 illustrates a metal-oxide semiconductor field-effect transistor (MOSFET) according to one embodiment of the present disclosure.

As discussed above, a number of implants, additional semiconductor layers, and/or metal layers may determine the device type and thus functionality of the vertical semiconductor device 16. In one embodiment, the vertical semiconductor device 16 is a PiN diode as shown in FIG. 9. Accordingly, the vertical semiconductor device 16 includes a p-layer 24 over the drift layer 22, an anode 26 over the p-layer 24, and a cathode 28 on the substrate 18 opposite the buffer layer 20. In another embodiment, the vertical semiconductor device 16 is a Schottky diode as shown in FIG. 10. Accordingly, the vertical semiconductor device 16 includes an anode 30 over the drift layer 22 and a cathode 32 on the substrate 18 opposite the buffer layer 20. One or more Schottky barrier regions 34 having an opposite doping type to the drift layer may be provided under the anode 30 to create a Schottky barrier diode (SBD). In yet another embodiment, the vertical semiconductor device 16 is a MOSFET as shown in FIG. 11. Accordingly, the vertical semiconductor device 16 includes a pair of junction implant regions 36, which are laterally separated from one another and include a source region 36A and a well region 36B, a gate oxide layer 38 running between the junction implant regions 36, a gate contact 40 over the gate oxide layer 38, a pair of source contacts 42 over a portion of the junction implant regions 36, and a drain contact 44 on the substrate 18 opposite the buffer layer 20. Those skilled in the art will appreciate that additional implanted regions, semiconductor layers, and/or metal layers may be provided to provide any number of different types of semiconductor devices, all of which are contemplated herein.

Figure 12:
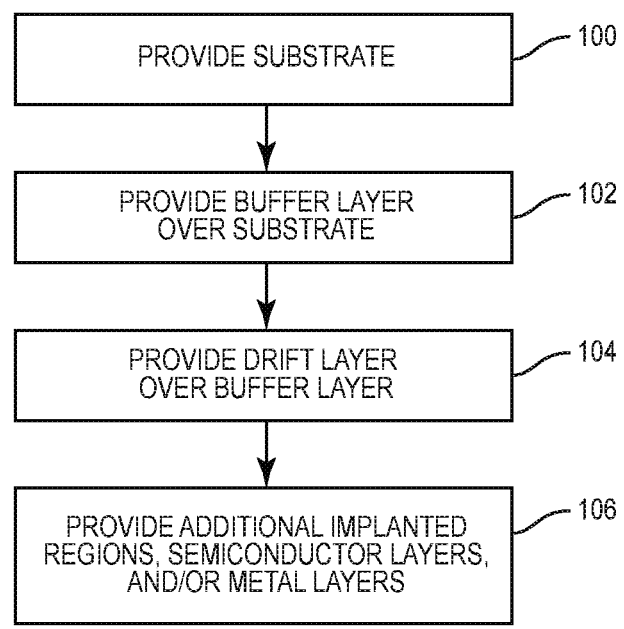
FIG. 12 is a flow chart illustrating a method for manufacturing a vertical semiconductor device according to one embodiment of the present disclosure.

FIG. 12 is a flow diagram illustrating a method for manufacturing a vertical semiconductor device according to one embodiment of the present disclosure. First, a substrate is provided (step 100). The substrate may be silicon carbide (SiC) as discussed above, and has a first doping type and a first doping concentration. A buffer layer is then provided over the substrate (step 102). The buffer layer has the first doping type and a second doping concentration that is less than the first doping concentration. The buffer layer may be epitaxially grown in an environment including dopants designed to create a desired doping profile, or may be grown and subsequently implanted (e.g., via ion implantation) to produce the desired doping profile. A drift layer is then provided over the buffer layer (step 104). The drift layer has the first doping type and a third doping concentration that is less than the second doping concentration. The drift layer may be epitaxially grown over the buffer layer. Finally, one or more additional implanted regions, semiconductor layers, and/or metal layers may be provided in order to provide a semiconductor device of a desired type (step 106). For example, a PiN diode, Schottky diode, MOSFET, or any other type of semiconductor device may be created by providing different implanted regions, semiconductor layers, and/or metal layers.

Those skilled in the art will recognize improvements and modifications to the preferred embodiments of the present disclosure. All such improvements and modifications are considered within the scope of the concepts disclosed herein and the claims that follow.

What is claimed is:

1. A vertical semiconductor device comprising:
a substrate having a first doping type and a first doping concentration;
a buffer layer on the substrate, the buffer layer having the first doping type and a second doping concentration that is less than the first doping concentration; and
a drift layer on the buffer layer such that the buffer layer is between the substrate and the drift layer, the drift layer having the first doping type and a third doping concentration that is less than the second doping concentration, wherein the substrate, the buffer layer, and the drift layer comprise silicon carbide, wherein the buffer layer has a thickness between 5% and 35% a thickness of the drift layer.

2. The vertical semiconductor device of claim 1 wherein a doping profile of the buffer layer is substantially constant.

3. The vertical semiconductor device of claim 1 wherein a doping profile of the buffer layer varies in a linear fashion between the first doping concentration and the third doping concentration.

4. The vertical semiconductor device of claim 1 wherein a doping profile of the buffer layer varies in a linear fashion such that a doping concentration of the buffer layer decreases in proportion to a distance toward the drift layer.

5. The vertical semiconductor device of claim 1 wherein a breakdown voltage of the vertical semiconductor device due to dislocation of charge particles in the vertical semiconductor device caused by radiation is greater than an avalanche breakdown voltage of the vertical semiconductor device.

6. The vertical semiconductor device of claim 1, wherein the vertical semiconductor device is a metal-oxide semiconductor field-effect transistor (MOSFET) comprising:
a pair of junction implants in the drift layer opposite the buffer layer;
a gate oxide layer over a portion of the pair of junction implants;
a gate contact over the gate oxide layer;
a source contact over another portion of the pair of junction implants; and
a drain contact on the substrate opposite the buffer layer.

7. The vertical semiconductor device of claim 1, wherein the vertical semiconductor device is a junction barrier Schottky (JBS) diode comprising:
a plurality of JBS implants in the drift layer opposite the buffer layer;
an anode on the drift layer opposite the buffer layer; and
a cathode on the substrate opposite the buffer layer.

8. The vertical semiconductor device of claim 7 wherein a doping profile of the buffer layer is substantially constant.

9. The vertical semiconductor device of claim 7 wherein a doping profile of the buffer layer varies in a linear fashion between the first doping concentration and the third doping concentration.

10. The vertical semiconductor device of claim 7 wherein a doping profile of the buffer layer varies in a linear fashion such that a doping concentration of the buffer layer decreases in proportion to a distance toward the drift layer.

11. The vertical semiconductor device of claim 7 wherein a breakdown voltage of the JBS diode due to dislocation of charge particles in the JBS diode caused by radiation is greater than an avalanche breakdown voltage of the JBS diode.

12. A vertical semiconductor device comprising:
a substrate having a first doping type and a first doping concentration;
a buffer layer on the substrate, the buffer layer having the first doping type and a second doping concentration that is less than the first doping concentration; and
a drift layer on the buffer layer such that the buffer layer is between the substrate and the drift layer, the drift layer having the first doping type and a third doping concentration that is less than the second doping concentration, wherein the substrate, the buffer layer, and the drift layer comprise silicon carbide;
wherein a doping profile of the buffer layer varies in a linear fashion such that a doping concentration of the buffer layer decreases in proportion to a distance toward the drift layer.

13. The vertical semiconductor device of claim 12 wherein a breakdown voltage of the vertical semiconductor device due to dislocation of charge particles in the vertical semiconductor device caused by radiation is greater than an avalanche breakdown voltage of the vertical semiconductor device.

14. The vertical semiconductor device of claim 12, wherein the vertical semiconductor device is a metal-oxide semiconductor field-effect transistor (MOSFET) comprising:
- a pair of junction implants in the drift layer opposite the buffer layer;
- a gate oxide layer over a portion of the pair of junction implants;
- a gate contact over the gate oxide layer;
- a source contact over another portion of the pair of junction implants; and
- a drain contact on the substrate opposite the buffer layer.

15. The vertical semiconductor device of claim 14 wherein the buffer layer has a thickness between 5% and 35% a thickness of the drift layer.

* * * * *